United States Patent
Lee et al.

(10) Patent No.: US 9,231,199 B2
(45) Date of Patent: Jan. 5, 2016

(54) ELECTRONIC DEVICE INCLUDING A SWITCH ELEMENT IN WHICH A METAL NITRIDE LAYER HAS A NITROGEN CONCENTRATION INCREASING AS A CLOSER DISTANCE FROM A SWITCHING LAYER, AND METHOD FOR FABRICATING THE SAME

(71) Applicant: SK hynix Inc., Icheon-si (KR)

(72) Inventors: Kee-Jeung Lee, Icheon-si (KR); Wan-Gee Kim, Icheon-si (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/273,431

(22) Filed: May 8, 2014

(65) Prior Publication Data

US 2015/0162529 A1   Jun. 11, 2015

(30) Foreign Application Priority Data

Dec. 5, 2013   (KR) .................. 10-2013-0150519

(51) Int. Cl.
*H01L 29/74* (2006.01)
*H01L 45/00* (2006.01)
*G06F 12/08* (2006.01)
*G06F 13/16* (2006.01)

(52) U.S. Cl.
CPC ............ *H01L 45/1253* (2013.01); *G06F 12/08* (2013.01); *G06F 13/1673* (2013.01); *H01L 45/141* (2013.01); *H01L 45/145* (2013.01); *H01L 45/146* (2013.01)

(58) Field of Classification Search
CPC ... H01L 45/1253; H01L 45/14; H01L 45/141; H01L 45/1608; H01L 45/1666; H01L 45/145; H01L 45/146
See application file for complete search history.

(56) References Cited

U.S. PATENT DOCUMENTS

| | | |
|---|---|---|
| 2009/0015369 A1 | 1/2009 | Takeda et al. |
| 2011/0278531 A1* | 11/2011 | Erbetta et al. ............. 257/4 |
| 2013/0170278 A1 | 7/2013 | Chen et al. |
| 2014/0166957 A1* | 6/2014 | Yang et al. ............... 257/1 |

* cited by examiner

Primary Examiner — Thanh Y Tran (57) ABSTRACT

An electronic device includes a switch element. The switch element includes a first electrode including a first metal nitride which is conductive, a second electrode, a switching layer interposed between the first electrode and the second electrode, and a first barrier layer which is interposed between the first electrode and the switching layer and includes a second metal nitride which is insulative, wherein a metal in the first metal nitride is the same as a metal in the second metal nitride, and a metal-to-nitrogen bonding ratio of the first metal nitride is different from a metal-to-nitrogen bonding ratio of the second metal nitride.

19 Claims, 8 Drawing Sheets

ELECTRONIC DEVICE INCLUDING A SWITCH ELEMENT IN WHICH A METAL NITRIDE LAYER HAS A NITROGEN CONCENTRATION INCREASING AS A CLOSER DISTANCE FROM A SWITCHING LAYER, AND METHOD FOR FABRICATING THE SAME

CROSS-REFERENCE TO RELATED APPLICATIONS

The present application claims priority to Korean Patent Application No. 10-2013-0150519, entitled "ELECTRONIC DEVICE AND METHOD FOR FABRICATING THE SAME" and filed on Dec. 5, 2013, which is incorporated herein by reference in its entirety.

BACKGROUND

1. Field

Embodiments of the present disclosure relate to memory circuits and devices and their applications in electronic devices or systems.

2. Description of the Related Art

As electronic appliances become smaller, semiconductor devices that have low power consumption, high performance, multi-functionality, and so on, are increasingly in demand. Semiconductor devices are devices that store information, and are utilized in various electronic appliances such as computers, portable communication devices, and so on. Such semiconductor devices store data using a characteristic switching between different resistance states according to a voltage or current applied thereto. For example, semiconductor devices include resistive random access memory (RRAM) devices, phase change random access memory (PRAM) devices, ferroelectric random access memory (FRAM) devices, magnetic random access memory (MRAM) devices, E-fuses, etc.

SUMMARY

Embodiments of the present disclosure relate to memory circuits and devices and their applications in electronic devices or systems. Embodiments include a switch element having excellent switching characteristics and reliability. Embodiments also contribute to the simplification of a manufacturing process.

In an embodiment, an electronic device includes a switch element that includes: a first electrode including a first metal nitride which is conductive; a second electrode; a switching layer interposed between the first electrode and the second electrode; and a first barrier layer which is interposed between the first electrode and the switching layer and includes a second metal nitride which is insulative, wherein a metal included in the first metal nitride and a metal included in the second metal nitride are same, and a metal-to-nitrogen bonding ratio of the first metal nitride is different from a metal-to-nitrogen bonding ratio of the second metal nitride.

Embodiments of the above device may include one or more of the following.

The switching layer includes a material that transitions between an insulator and a conductor based on Joule heating. The switching layer includes a niobium oxide, a vanadium oxide, or a material containing a chalcogenide-based element. The first electrode cuts off heat emission from the switching layer, and the first barrier layer cuts off a current flow when a supplied current or voltage is lower than a predetermined threshold value. The first metal nitride and the second metal nitride are tantalum nitrides. The metal-to-nitrogen bonding ratio of the first metal nitride ranges from approximately 1:1 to approximately 1:1.5, and the metal-to-nitrogen bonding ratio of the second metal nitride is approximately 3:5. The second electrode includes the first metal nitride, and the switch element further includes: a second barrier layer that is interposed between the second electrode and the switching layer and includes the second metal nitride. The electronic device further comprises a memory element that is electrically connected to the switch element, and the memory element comprises: a third electrode; a fourth electrode; and a variable resistance layer interposed between the third electrode and the fourth electrode. The electronic device further comprises a plurality of first lines stretched in a first direction; a plurality of second lines stretched in a second direction that intersects with the first direction; and a plurality of memory cells each of which is disposed at a cross point between one first line and one second line between the first lines and the second lines, wherein each memory cell includes the switch element and the memory element.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the switch element and the memory element is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the switch element and the memory element is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the switch element and the memory element is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted form an outside; a temporary storage device configured to temporarily store data exchanged between the storage device and the outside; and an interface configured to perform communication between at least one of the storage device, the controller and the temporary storage device and the outside, wherein the switch element and the memory element is part of the storage device or the temporary storage device in the data storage system.

The electronic device may further include a memory system which includes: a memory configured to store data and conserve stored data regardless of power supply; a memory controller configured to control input and output of data to and from the memory according to a command inputted form an outside; a buffer memory configured to buffer data exchanged between the memory and the outside; and an interface configured to perform communication between at least one of the memory, the memory controller and the buffer memory and the outside, wherein the switch element and the memory element is part of the memory or the buffer memory in the memory system.

In another embodiment, an electronic device including a switch element that includes: a switching layer; and a metal nitride layer which contacts the switching layer and has a content of nitrogen that decreases as a distance from the switching layer becomes farther, wherein the metal nitride layer includes a first portion relatively far from the switching layer and a second portion relatively close to the switching layer, and the first portion includes a first metal nitride which is conductive while the second portion includes a second metal nitride which is insulative.

Embodiments of the above device may include one or more of the following.

The switching layer includes a material that transitions between an insulator and a conductor based on Joule heating. The first portion cuts off heat emission from the switching layer, and the second portion cuts off a current flow when a supplied current or voltage is lower than a predetermined threshold value. The metal nitride includes a tantalum nitride. A metal-to-nitrogen bonding ratio of the first metal nitride ranges from approximately 1:1 to approximately 1:1.5, and a metal-to-nitrogen bonding ratio of the second metal nitride is approximately 3:5.

In another embodiment, a method for fabricating an electronic device including a switch element includes: forming a first electrode including a first metal nitride which is conductive; forming a first barrier layer which includes a second metal nitride which is insulative over the first electrode, wherein a metal included in the first metal nitride and a metal included in the second metal nitride are same, and a metal-to-nitrogen bonding ratio of the first metal nitride is different from a metal-to-nitrogen bonding ratio of the second metal nitride; and forming a switching layer over the first barrier layer.

Embodiments of the above method may include one or more of the following.

The forming of the first electrode and the forming of the first barrier layer are performed by a deposition process in which a metal target is used and nitrogen is supplied, wherein a content of nitrogen supplied during the forming of the first electrode and a content of nitrogen supplied during the forming of the first barrier layer are different from each other. The forming of the first electrode and the forming of the first barrier layer are performed by a deposition process in which a tantalum target is used and nitrogen is supplied, wherein a content of nitrogen supplied during the forming of the first barrier layer is higher than a content of nitrogen supplied during the forming of the first electrode. The metal-to-nitrogen bonding ratio of the first metal nitride ranges from approximately 1:1 to approximately 1:1.5, and the metal-to-nitrogen bonding ratio of the second metal nitride is approximately 3:5. The method further comprises forming a second barrier layer including the second metal nitride over the switching layer; and forming a second electrode including the first metal nitride over the second barrier layer. The method further comprises forming a variable resistance layer over the second electrode.

These and other aspects, implementations and associated advantages will be apparent in view of the drawings, the description, and the claims.

DETAILED DESCRIPTION

Embodiments of the present disclosure are described below in detail with reference to the accompanying drawings.

The drawings may not be necessarily to scale and in some instances, proportions of at least some structures in the drawings may be exaggerated in order to clearly illustrate certain features of embodiments. In presenting an embodiment in a drawing or description as having two or more layers in a multi-layer structure, the relative positioning of such layers or the sequence in which the layers are arranged reflects a particular implementation of an embodiment and a different relative positioning or sequence of arranged layers may be possible. In addition, a description or illustration of an embodiment of a multi-layer structure may not reflect all layers present in that particular multi-layer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers exist between the first layer and the second layer or the substrate.

A switch element and a memory element in accordance with an embodiment of the present disclosure are generally described below.

A switch element in accordance with an embodiment of the present disclosure is a device that is turned on to create a current flow or turned off to cut off a current flow. The switch element may include any of a diode, a transistor, a tunnel barrier formed of an insulating substance, a metal-insulator transition (MIT) device, a varistor, an ovonic threshold switching (OTS) device, and so forth. The switch element may be serially coupled with one end of a memory element, and may function as a selective device that controls access to the memory element.

A memory element in accordance with an embodiment of the present disclosure stores data based on variable resistance characteristics, in which the memory element switches between different resistance states depending on a voltage or a current applied thereto. The memory element may include two electrodes for applying a voltage or a current and a variable resistance material layer interposed between the two electrodes. The variable resistance material layer may be a single layer or a multi-layer containing one or more layers of diverse materials which include a transition metal oxide, a metal oxide such as a perovskite-based material, a phase-change material such as a chalcogenide-based material, a ferroelectric material, a ferromagnetic material, and the like.

The switch element and the memory element that are coupled with each other may form a unit memory cell. A plurality of memory cells is arrayed to form a cell array. A cell array where memory cells are disposed at cross points between two kinds of lines that cross each other, such as source lines and bit lines, is referred to as a cross-point cell array.

Hereafter, a switch element in accordance with an embodiment of the present disclosure will be described with reference to FIGS. 1 to 3B. Memory cells in accordance with an embodiment of the present disclosure will be described with reference to FIG. 4, and a cell array in accordance with an embodiment of the present disclosure will be described with reference to FIG. 5.

Figure 1:
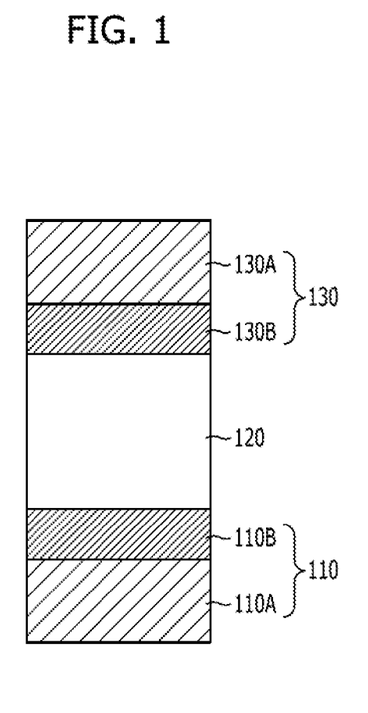
FIG. 1 is a cross-sectional view illustrating a switch element in accordance with an embodiment of the present disclosure.
Figure 2:
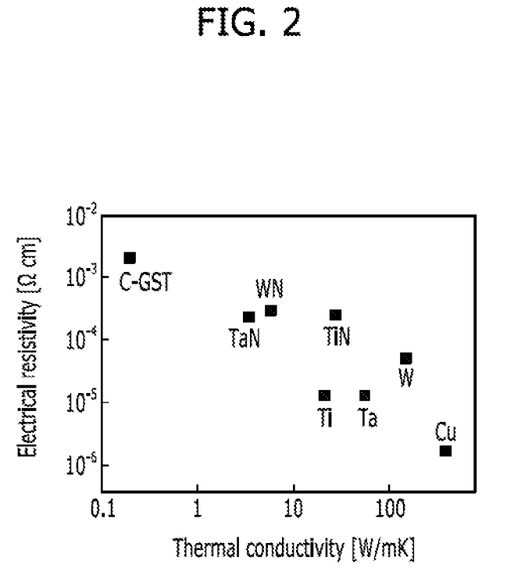
FIG. 2 is a graph showing properties of an electrode material.

FIG. 1 is a cross-sectional view illustrating a switch element in accordance with an embodiment of the present disclosure.

Referring to FIG. 1, the switch element includes a lower metal nitride layer 110, an upper metal nitride layer 130, and a switching layer 120 interposed between the lower metal nitride layer 110 and the upper metal nitride layer 130.

The lower metal nitride layer 110 includes a first lower metal nitride layer 110A and a second lower metal nitride layer 110B, which are formed of the same metal nitride but have different metal-to-nitrogen bonding ratios. The second lower metal nitride layer 110B is stacked over the first lower metal nitride layer 110A. Herein, the first lower metal nitride layer 110A and the second lower metal nitride layer 110B may be formed of a metal nitride whose electrical characteristics are different according to a metal-to-nitrogen bonding ratio. In an embodiment, the bonding ratio of metal to nitride is within a range of about 1:1 to about 1:1.5 to form a region having conductive properties. In an embodiment, the ratio of metal to nitride is about 3:5 to form a region having insulative properties. In an embodiment, the metal nitride is a tantalum nitride. Tantalum nitride is known to have a conductive property when a bonding ratio of tantalum to nitrogen ranges from approximately 1:1 to approximately 1:1.5, and an insulating property when the bonding ratio of tantalum to nitrogen is approximately 3:5. In an embodiment, the first lower metal nitride layer 110A includes a conductive metal nitride such as TaN or $Ta_2N_3$, whereas the second lower metal nitride layer 110B includes an insulative metal nitride such as $Ta_3N_5$.

Since the first lower metal nitride layer 110A is conductive, it may function as an electrode for applying a voltage or a current to the switching layer 120. Hereafter, the first lower metal nitride layer 110A is referred to as an electrode. Even when the switch element is turned off, a current flows through the switch element, and is referred to as an 'off current'. Since the second lower metal nitride layer 110B has an insulating property, the second lower metal nitride layer 110B may function as an electrical barrier that reduces an off current flowing through the switch element. Hereafter, the second lower metal nitride layer 110B is referred to as a barrier layer. The barrier layer will be described in more detail later.

A method for forming the lower metal nitride layer 110 is described hereafter. The lower metal nitride layer 110 may be formed by performing a reactive Physical Vapor Deposition (PVD) process using a target metal and nitrogen. Nitrogen is supplied to a first portion where the first lower metal nitride layer 110A is formed until a first concentration is reached, and then nitrogen is supplied to a second portion where the second lower metal nitride layer 110B is formed until a second concentration is reached, the second concentration being different from the first concentration. In an embodiment, when the first lower metal nitride layer 110A is formed of a conductive tantalum nitride and the second lower metal nitride layer 110B is formed of an insulative tantalum nitride, nitrogen is supplied to the first portion until a predetermined concentration is reached, and then nitrogen is supplied to the second portion until a higher concentration than the predetermined concentration is reached. In other words, the first lower metal nitride layer 110A and the second lower metal nitride layer 110B, which have different electrical characteristics, may be formed during a single process by controlling the concentration of nitrogen supplied to portions where the first and second lower metal nitride layers 110A and 110B are formed.

Similar to the lower metal nitride layer 110, the upper metal nitride layer 130 may include two portions: a first upper metal nitride layer 130A and a second upper metal nitride layer 130B. The first and second upper metal nitride layers 130A and 130B have different electrical characteristics due to different metal-to-nitrogen bonding ratios. The first upper metal nitride layer 130A may have a conductive property, while the second upper metal nitride layer 130B has an insulating property. In an embodiment, the upper metal nitride layer 130 may be symmetrical to the lower metal nitride layer 110 with respect to the switching layer 120 interposed between them. In other words, the first upper metal nitride layer 130A may be disposed over the second upper metal nitride layer 130B. The first upper metal nitride layer 130A may function as an electrode that applies a voltage or a current to both ends of the switching layer 120 along with the first lower metal nitride layer 110A, which is also an electrode. The second upper metal nitride layer 130B may function as an electrical barrier for reducing the off current. Hereafter, the first upper metal nitride layer 130A may be referred to as an electrode, and the second upper metal nitride layer 130B may be referred to as a barrier layer. The first upper metal nitride layer 130A and the second upper metal nitride layer 130B may be formed during a single process, e.g., a reactive PVD process, by controlling the concentration of nitrogen supplied to portions where the first and second upper metal nitride layers 130A and 130B are formed.

The switching layer 120 may be formed of a material that is turned on or off depending on the voltage or current applied through the two electrodes 110A and 130A disposed on both ends of the switching layer 120. In an embodiment, the switching layer 120 may include a material that switches between an insulator and a conductor based on Joule heating, which is induced by the current supplied through the two electrodes 110A and 130A. The material of the switching layer 120 includes any of a niobium oxide, a vanadium oxide, and an ovonic threshold switching (OTS) material containing a chalcogenide-based element. The OTS material includes arsenic (As), tellurium (Te), germanium (Ge), antimony (Sb), selenium (Se), or the like. Since the switching layer 120 includes a metal, it has a narrow energy band gap, and thus may increase the off current of the switch element.

To reduce the off current of the switch element, the barrier layers 110B and 130B are interposed between the electrodes 110A and 130A and the switching layer 120, respectively. Since the barrier layers 110B and 130B are insulative, they have wider energy band gaps than the switching layer 120. Therefore, a current flowing through the barrier layers 110B and 130B may be cut off almost completely until a voltage or current applied to the barrier layers 110B and 130B reaches a predetermined threshold value that allows tunneling of charges. In other words, when the voltage or current applied through the electrodes 110A and 130A is relatively low, such when the switch element is turned off, the barrier layers 110B and 130B may cut off the current flowing through the switching layer 120. This may prevent the increase of the off current caused by the characteristics of a material that forms the switch element.

Meanwhile, when the electrodes 110A and 130A are formed of a tantalum nitride, thermal efficiency of the switch element may be increased because the heat generated in the switching layer 120 is substantially prevented from being emitted to outside of the switch element. This is because the thermal conductivity of the tantalum nitride is relatively lower than that of other conductive materials such as WN, TiN, Ti, Ta, W, Cu, or the like (refer to FIG. 2). As a result, the energy used when the switching layer 120 transitions from an insulator to a conductor or from a conductor to an insulator is decreased, which reduces a threshold voltage Vth and the off current of the switch element.

The switch element and the method for fabricating the switch element according to embodiments of the present disclosure may have any of the following advantages.

In the first place, the off current of the switch element may be reduced by interposing the insulative barrier layers 110B and 130B between the electrodes 110A and 130A and the switching layer 120, respectively. Therefore, a material that switches between an insulator and a conductor based on Joule heating generated therein may be used to form the switching layer 120.

Also, since the barrier layers 110B and 130B are formed of the same metal as that used to form the electrodes 110A and 130A, the electrodes 110A and 130A and the barrier layers 110B and 130B may be formed during a single process, which simplifies the fabrication process.

Furthermore, when a metal nitride, which has a lower thermal conductivity and may substantially prevent heat emission from the switching layer 120, such as a tantalum nitride, is used for forming the electrodes 110A and 130A, the energy used in switching is decreased and thus the off current and threshold voltage Vth of the switch element may be decreased even more.

In the above embodiments, the lower metal nitride layer 110 and the upper metal nitride layer 130 are disposed on both ends of the switching layer 120. In another embodiment, the metal nitride layer is disposed on one end of the switching layer 120, and a typical electrode including a conductive material is disposed on the other end.

Also, although FIG. 1 illustrates a clear interface between the first lower and upper metal nitride layers 110A and 130A and the second lower and upper metal nitride layers 110B and 130B for convenience of illustration, there is no clear interface and nitrogen may be distributed to have a gradient in the lower metal nitride layer 110 and the upper metal nitride layer 130. This will be described with reference to FIGS. 3A and 3B.

Figure 3A:
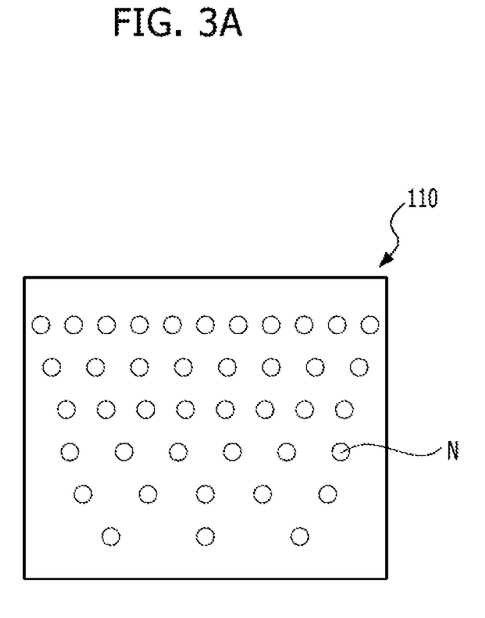
FIG. 3A illustrates the distribution of nitrogen in a lower metal nitride layer shown in FIG. 1.
Figure 3B:
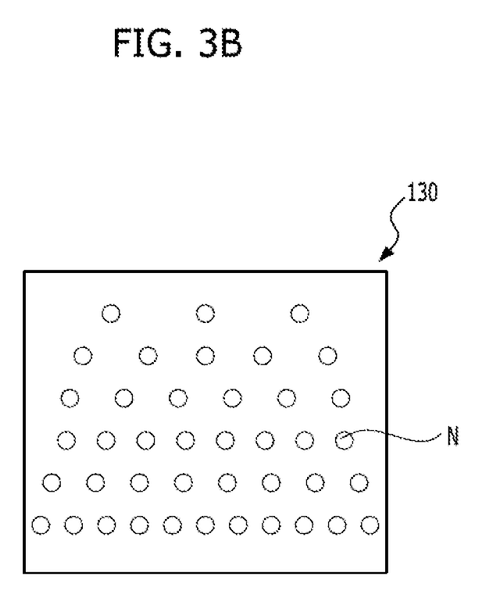
FIG. 3B illustrates the distribution of nitrogen in an upper metal nitride layer shown in FIG. 1.

FIG. 3A illustrates the distribution of nitrogen in the lower metal nitride layer 110 shown in FIG. 1. FIG. 3B illustrates the distribution of nitrogen in the upper metal nitride layer 130 shown in FIG. 1.

Referring to FIG. 3A, a gradient of nitrogen (N) may be formed. The concentration of nitrogen (N) in the lower metal nitride layer 110 may decrease going farther from the switching layer 120. In other words, the amount of nitrogen in an area near the switching layer 120 may be greater than the amount of nitrogen in an area further from the switching layer 120. That is, with respect to the orientation of the figure, the concentration of nitrogen may decrease toward the bottom side of the lower metal nitride layer 110 in a vertical direction. Thus, a lower portion of the lower metal nitride layer 110, which has a conductive property, is the first lower metal nitride layer 110A. An upper portion of the lower metal nitride layer 110, which has an insulating property, is the second lower metal nitride layer 110B. However, there is not a clearly distinguishable interface between the first lower metal nitride layer 110A and the second lower metal nitride layer 110B. As described above, the first lower metal nitride layer 110A having the conductive property serves as an electrode, while the second lower metal nitride layer 110B having the insulating property serves as a barrier layer.

Referring to FIG. 3B, the concentration of nitrogen (N) in the upper metal nitride layer 130 may decrease going farther from the switching layer 120. The amount of nitrogen in an area of the upper metal nitride layer 130 that is close to the switching layer 120 may be greater than the amount of nitrogen in an area of the upper metal layer 130 that is further from the switching layer. In other words, with respect to the orientation of the figure, the amount of nitrogen may increase toward the bottom side of the upper metal nitride layer 130 in the vertical direction. An upper portion of the upper metal nitride layer 130, which has a conductive property, is the first upper metal nitride layer 130A. A lower portion of the upper metal nitride layer 130, which has an insulating property, is the second upper metal nitride layer 130B. However, there is not a clearly distinguishable interface between the first upper metal nitride layer 130A and the second upper metal nitride layer 130B. As described above, the first upper metal nitride layer 130A having the conductive property serves as an electrode, while the second upper metal nitride layer 130B having the insulating property serves as a barrier layer.

Figure 4:
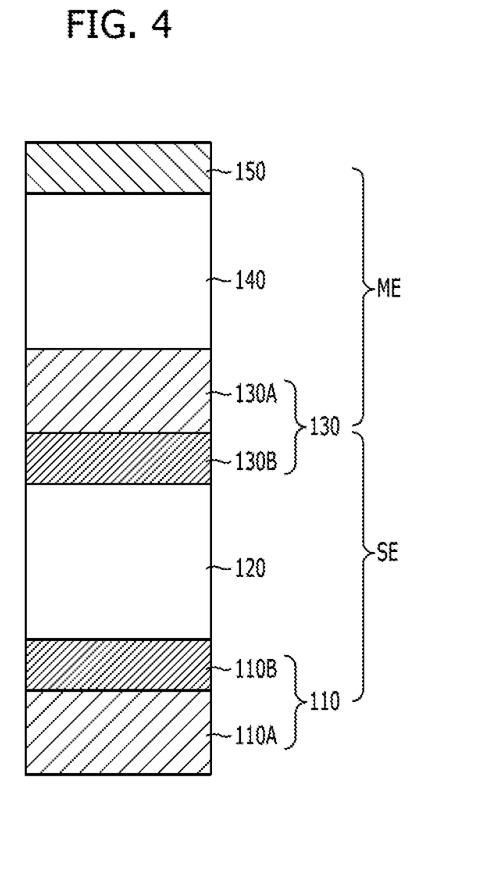
FIG. 4 is a cross-sectional view illustrating a memory cell in accordance with an embodiment of the present disclosure.

FIG. 4 is a cross-sectional view illustrating a memory cell in accordance with an embodiment of the present disclosure. The memory cell includes a switch element SE and a memory element ME that are serially coupled with each other.

The switch element SE has substantially the same configuration as the switch element shown in FIG. 1.

The memory element ME includes two electrodes 130A and 150 and a variable resistance layer 140 interposed between the two electrodes 130A and 150. In the embodiment shown in FIG. 4, the memory element ME and the switch element SE share one electrode 130A, but embodiments are not limited thereto. In another embodiment, the memory element ME may not share the electrode 130A with the switch element SE, and another electrode (not shown) is interposed between the electrode 130A and the variable resistance layer 140. The electrode 150 of the memory element ME and the additional interposed electrode may be formed of a conductive material, such as a metal, a metal nitride, or the like.

The variable resistance layer 140 may be a single layer including a material that switches between a high resistance state and a low resistance state, or a multi-layer. The material includes one or more selected from materials used for a resistive random access memory (RRAM), a phase change random access memory (PRAM), a ferroelectric random access memory (FRAM), a magnetic random access memory (MRAM), and so forth. In an embodiment, the variable resistance layer 140 is formed of a metal oxide including oxygen vacancies. In this case, as filaments, which form a current path in the variable resistance layer 140, are generated or disappear according to the movement of the oxygen vacancies, the variable resistance layer 140 comes to have a high resistance state or a low resistance state. When the filaments are generated within the variable resistance layer 140, the metal oxide has a low resistance state. On the other hand, when the filaments disappear, the metal oxide has a high resistance state. However, embodiments are not limited thereto as long as the variable resistance layer 140 has resistance switching characteristics according to a current or voltage applied thereto through the switch element SE.

Figure 5:
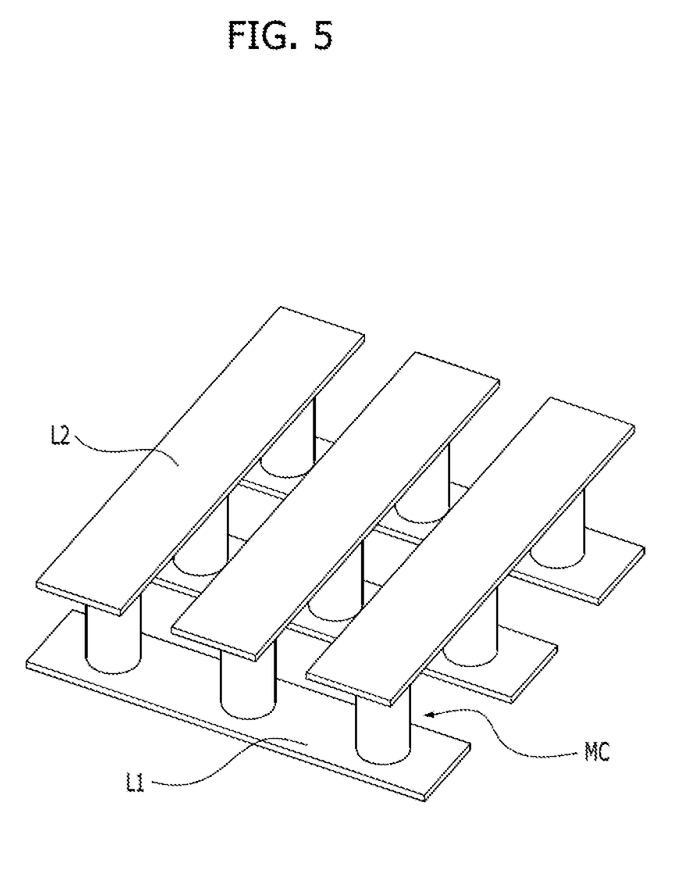
FIG. 5 is a perspective view of a cell array in accordance with an embodiment of the present disclosure.

FIG. 5 is a perspective view of a cell array in accordance with an embodiment of the present disclosure. The cell array includes a plurality of first lines L1, a plurality of second lines L2, and memory cells MCs. With respect to the orientation of the figure, the first lines L1 extend in a first horizontal direction, and the second lines L2 are spaced apart from the first lines L1 in a vertical direction and extend in a second horizontal direction that crosses the first horizontal direction. As a result, the second lines L2 intersect with the first lines L1. Each of the memory cells MCs is disposed at a cross point between a first line L1 and a corresponding second line L2, i.e., a region where a first line L1 and a second line L2 intersect.

The first lines L1 and the second lines L2 may be formed of a conductive material, such as a metal, a metal nitride, or the like. In an embodiment, the first lines L1 and the second lines L2 are formed of a conductive material having a low resistance.

The memory cell MC may have substantially the same configuration as the memory cell shown in FIG. 4.

In the cell array having the above-described structure, the first line L1 and the second line L2, which are coupled to a selected memory cell MC, are also coupled to unselected memory cells MC since each of the first lines L1 and the second lines L2 are coupled to a plurality of memory cells MCs. Therefore, a current leakage may occur through the unselected memory cells MCs that share the first line L1 and the second line L2 coupled with the selected memory cell MC. However, since a switch element in accordance with an embodiment of the present disclosure has excellent switching characteristics and is capable of reducing an off current due to the presence of a barrier layer that is coupled with a memory element ME, the current leakage may be substantially prevented.

Meanwhile, although, in the embodiments described above, a memory cell MC is interposed between the first line L1 and the second line L2, embodiments are not limited thereto. The electrode 110A and/or the barrier layer 110B of the switch element SE shown in FIG. 4 may be a the shape of a line instead of the first lines L1, and the electrode 150 of the memory element ME may be in the shape of a line instead of the second lines L2.

According to embodiments of the present disclosure, an electronic device and a method for fabricating the same provide a switch element having excellent switching characteristics and reliability. Embodiments also provide a simplified process for fabricating an electronic device.

The above and other memory circuits or semiconductor devices based on the disclosed technology can be used in a range of devices or systems. FIGS. 6-10 provide some examples of devices or systems that can implement a memory circuit in accordance with an embodiment.

Figure 6:
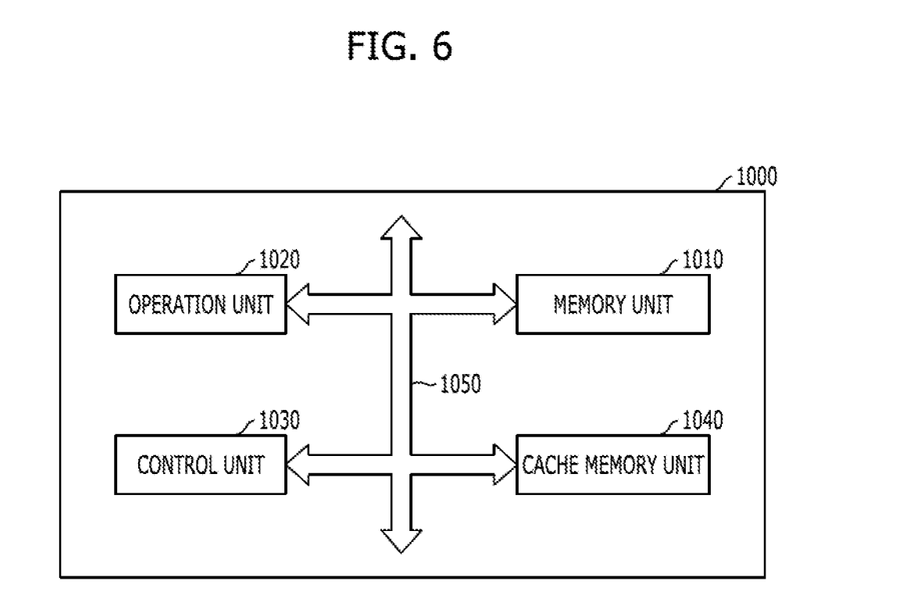
FIG. 6 illustrates a microprocessor implementing memory circuitry based on the disclosed technology.

FIG. 6 illustrates a microprocessor implementing memory circuitry based on the disclosed technology.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a memory element and a switch element, and the switch element includes a first electrode including a first metal nitride which is conductive; a second electrode; a switching layer interposed between the first electrode and the second electrode; and a first barrier layer which is interposed between the first electrode and the switching layer and includes a second metal nitride which is insulative, wherein a metal included in the first metal nitride and a metal included in the second metal nitride are same, and a metal-to-nitrogen bonding ratio of the first metal nitride is different from a metal-to-nitrogen bonding ratio of the second metal nitride. Through this, data storage characteristics of the memory unit 1010 may be improved. As a consequence, performance characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
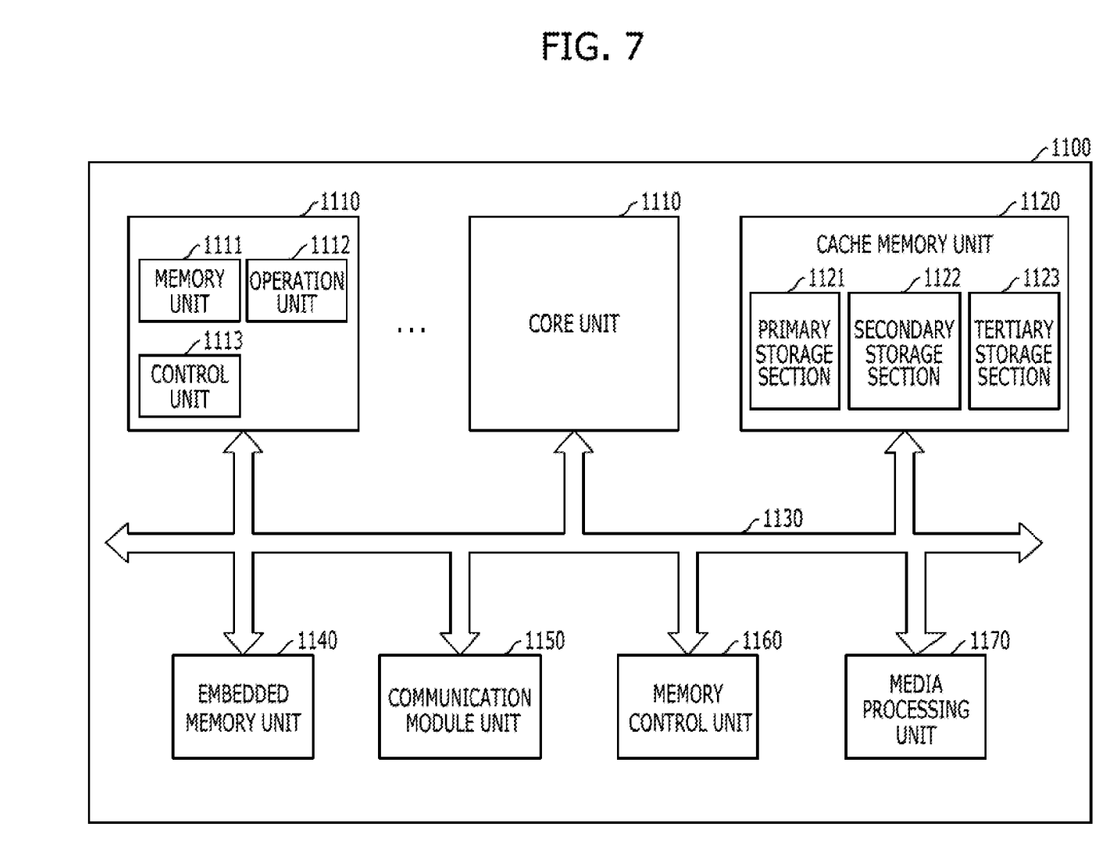
FIG. 7 illustrates a processor implementing memory circuitry based on the disclosed technology.

FIG. 7 illustrates a processor implementing memory circuitry based on the disclosed technology.

Referring to FIG. 7, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a memory element and a switch element, and the switch element includes a first electrode including a first metal nitride which is conductive; a second electrode; a switching layer interposed between the first electrode and the second electrode; and a first barrier layer which is interposed between the first electrode and the switching layer and includes a second metal nitride which is insulative, wherein a metal included in the first metal nitride and a metal included in the second metal nitride are same, and a metal-to-nitrogen bonding ratio of the first metal nitride is different from a metal-to-nitrogen bonding ratio of the second metal nitride. Through this, data storage characteristics of the cache memory unit 1120 may be improved. As a consequence, performance characteristics of the processor 1100 may be improved.

Although it was shown in FIG. 7 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 8:
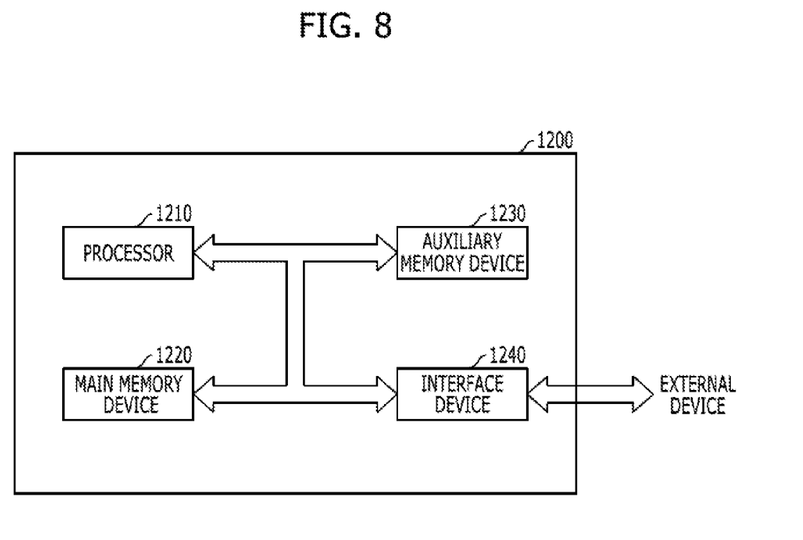
FIG. 8 illustrates a system implementing memory circuitry based on the disclosed technology.

FIG. 8 illustrates a system implementing memory circuitry based on the disclosed technology.

Referring to FIG. 8, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a memory element and a switch element, and the switch element includes a first electrode including a first metal nitride which is conductive; a second electrode; a switching layer interposed between the first electrode and the second electrode; and a first barrier layer which is interposed between the first electrode and the switching layer and includes a second metal nitride which is insulative, wherein a metal included in the first metal nitride and a metal included in the second metal nitride are same, and a metal-to-nitrogen bonding ratio of the first metal nitride is different from a metal-to-nitrogen bonding ratio of the second metal nitride. Through this, data storage characteristics of the main memory device 1220 may be improved. As a consequence, performance characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a memory element and a switch element, and the switch element includes a first electrode including a first metal nitride which is conductive; a second electrode; a switching layer interposed between the first electrode and the second electrode; and a first barrier layer which is interposed between the first electrode and the switching layer and includes a second metal nitride which is insulative, wherein a metal included in the first metal nitride and a metal included in the second metal nitride are same, and a metal-to-nitrogen bonding ratio of the first metal nitride is different from a metal-to-nitrogen bonding ratio of the second metal nitride. Through this, data storage characteristics of the auxiliary memory device 1230 may be improved. As a consequence, performance characteristics of the system 1200 may be improved.

Also, the auxiliary memory device 1230 may further include a data storage system (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 10) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 9:
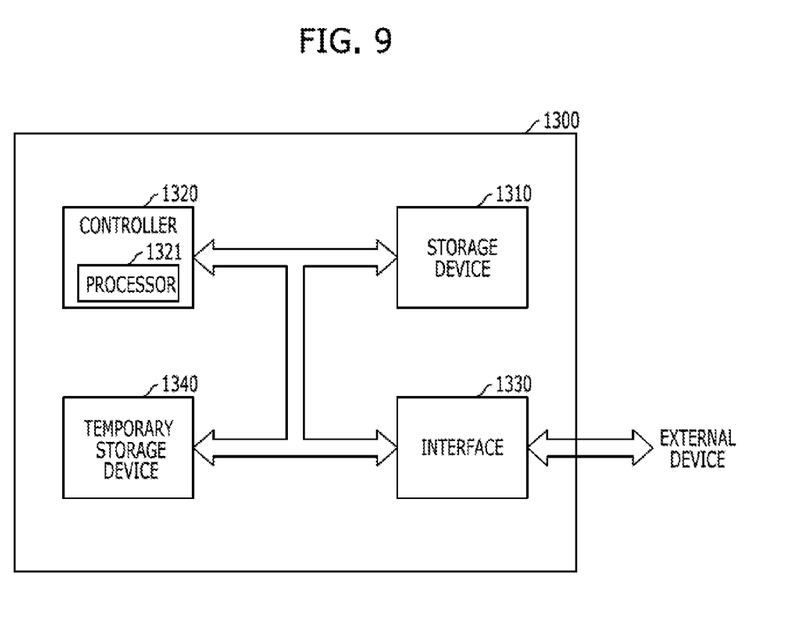
FIG. 9 illustrates a data storage system implementing memory circuitry based on the disclosed technology.

FIG. 9 illustrates a data storage system implementing memory circuitry based on the disclosed technology.

Referring to FIG. 9, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a memory element and a switch element, and the switch element includes a first electrode including a first metal nitride which is conductive; a second electrode; a switching layer interposed between the first electrode and the second electrode; and a first barrier layer which is interposed between the first electrode and the switching layer and includes a second metal nitride which is insulative, wherein a metal included in the first metal nitride and a metal included in the second metal nitride are same, and a metal-to-nitrogen bonding ratio of the first metal nitride is different from a metal-to-nitrogen bonding ratio of the second metal nitride. Through this, data storage characteristics of the temporary storage device 1340 may be improved. As a consequence, performance characteristics of the data storage system 1300 may be improved.

Figure 10:
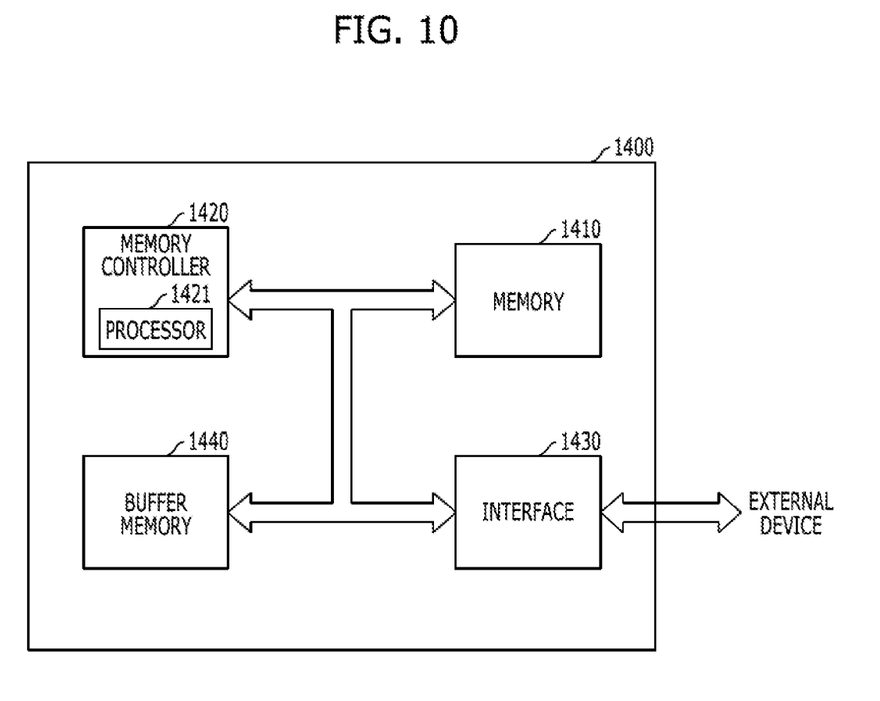
FIG. 10 illustrates a memory system implementing memory circuitry based on the disclosed technology.

FIG. 10 illustrates a memory system implementing memory circuitry based on the disclosed technology.

Referring to FIG. 10, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a memory element and a switch element, and the switch element includes a first electrode including a first metal nitride which is conductive; a second electrode; a switching layer interposed between the first electrode and the second electrode; and a first barrier layer which is interposed between the first electrode and the switching layer and includes a second metal nitride which is insulative, wherein a metal included in the first metal nitride and a metal included in the second metal nitride are same, and a metal-to-nitrogen bonding ratio of the first metal nitride is different from a metal-to-nitrogen bonding ratio of the second metal nitride. Through this, data storage characteristics of the memory 1410 may be improved. As a consequence, performance characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a memory element and a switch element, and the switch element includes a first electrode including a first metal nitride which is conductive; a second electrode; a switching layer interposed between the first electrode and the second electrode; and a first barrier layer which is interposed between the first electrode and the switching layer and includes a second metal nitride which is insulative, wherein a metal included in the first metal nitride and a metal included in the second metal nitride are same, and a metal-to-nitrogen bonding ratio of the first metal nitride is different from a metal-to-nitrogen bonding ratio of the second metal nitride. Through this, data storage characteristics of the buffer memory 1440 may be improved. As a consequence, performance characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features of the above electronic devices or systems in FIGS. 6-10 based on a memory device in accordance with an embodiment of the present disclosure may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While the present disclosure contains many specifics, these should not be construed as limitations on the scope of any invention or of what may be claimed, but rather as descriptions of features that may be specific to particular embodiments of particular inventions. Certain features that are described in the present disclosure in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve described results. Moreover, the separation of various system components in the embodiments described in the present disclosure should not be understood as requiring such separation in all embodiments.

Only a few implementations and examples are described. Other implementations, enhancements and variations can be made based on what is described and illustrated in the present disclosure.

What is claimed is:

1. An electronic device comprising a switch element, wherein the switch element comprises:
a first electrode including a first metal nitride which is conductive;
a second electrode;
a switching layer interposed between the first electrode and the second electrode; and a first barrier layer interposed between the first electrode and the switching layer, the first barrier layer including a second metal nitride, wherein a metal in the first metal nitride is the same as a metal in the second metal nitride, and wherein a concentration of nitrogen of the second metal nitride is greater than that of the first metal nitride so that the first barrier layer is relatively insulative compared to the first electrode.

2. The electronic device according to claim 1, wherein the switching layer includes a material that switches between an insulator and a conductor based on Joule heating generated therein.

3. The electronic device according to claim 2, wherein the switching layer includes a niobium oxide, a vanadium oxide, or a material including a chalcogenide-based element.

4. The electronic device according to claim 2, wherein the first electrode substantially prevents heat emission from the switching layer, and wherein the first barrier layer cuts off a current flow therein when a current or voltage supplied to the first barrier layer is lower than a threshold value.

5. The electronic device according to claim 1, wherein the first metal nitride and the second metal nitride are tantalum nitrides.

6. The electronic device according to claim 5, wherein a metal-to-nitrogen bonding ratio of the first metal nitride ranges from approximately 1:1 to approximately 1:1.5, and wherein a metal-to-nitrogen bonding ratio of the second metal nitride is approximately 3:5.

7. The electronic device according to claim 1, wherein the second electrode includes the first metal nitride, and wherein the switch element further comprises:

a second barrier layer that is interposed between the second electrode and the switching layer, the second barrier layer including the second metal nitride.

8. The electronic device according to claim 1, further comprising:

a memory element that is electrically coupled to the switch element, wherein the memory element comprises:

a third electrode;

a fourth electrode; and a variable resistance layer interposed between the third electrode and the fourth electrode.

9. The electronic device according to claim 8, further comprising:

a plurality of first lines extending in a first direction;

a plurality of second lines extending in a second direction that intersects with the first direction, the plurality of second lines being spaced apart from the plurality of first lines in a third direction perpendicular to the first direction and the second direction; and a plurality of memory cells, each memory cell being disposed at a cross point between one of the first lines and one of the second lines, wherein each of the memory cells includes the switch element and the memory element.

10. The electronic device according to claim 8, further comprising a microprocessor which includes:

a control unit configured to receive a signal including a command from an outside of the microprocessor, and performs extracting, decoding of the command, or controlling input or output of a signal of the microprocessor;

an operation unit configured to perform an operation based on a result that the control unit decodes the command; and a memory unit configured to store data for performing the operation, data corresponding to a result of performing the operation, or an address of data for which the operation is performed, wherein the switch element and the memory element is part of the memory unit in the microprocessor.

11. The electronic device according to claim 8, further comprising a processor which includes:

a core unit configured to perform, based on a command inputted from an outside of the processor, an operation corresponding to the command, by using data;

a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the switch element and the memory element is part of the cache memory unit in the processor.

12. The electronic device according to claim 8, further comprising a processing system which includes:

a processor configured to decode a command received by the processor and control an operation for information based on a result of decoding the command;

an auxiliary memory device configured to store a program for decoding the command and the information;

a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the switch element and the memory element is part of the auxiliary memory device or the main memory device in the processing system.

13. The electronic device according to claim 8, further comprising a data storage system which includes:

a storage device configured to store data and conserve stored data regardless of power supply;

a controller configured to control input and output of data to and from the storage device according to a command inputted form an outside;

a temporary storage device configured to temporarily store data exchanged between the storage device and the outside; and an interface configured to perform communication between at least one of the storage device, the controller and the temporary storage device and the outside, wherein the switch element and the memory element is part of the storage device or the temporary storage device in the data storage system.

14. The electronic device according to claim 8, further comprising a memory system which includes:

a memory configured to store data and conserve stored data regardless of power supply;

a memory controller configured to control input and output of data to and from the memory according to a command inputted form an outside;

a buffer memory configured to buffer data exchanged between the memory and the outside; and an interface configured to perform communication between at least one of the memory, the memory controller and the buffer memory and the outside, wherein the switch element and the memory element is part of the memory or the buffer memory in the memory system.

15. An electronic device comprising a switch element, wherein the switch element comprises:
   a switching layer; and
   a metal nitride layer which contacts the switching layer, the metal nitride layer including a gradient in which a concentration of nitrogen in the metal nitride layer increases as a closer distance from the switching layer,
   wherein the metal nitride layer includes a first portion relatively far from the switching layer and a second portion relatively close to the switching layer, and
   wherein the first portion includes a first metal nitride which is relatively conductive compared to the second portion and the second portion includes a second metal nitride which is relatively insulative compared to the first portion.

16. The electronic device according to claim 15, wherein the switching layer includes a material that switches between an insulator and a conductor based on Joule heating generated therein.

17. The electronic device according to claim 16, wherein the first portion substantially prevents heat emission from the switching layer, and
   wherein the second portion cuts off a current flow therein when a current or voltage supplied to the metal nitride layer is lower than a threshold value.

18. The electronic device according to claim 15, wherein the first and second metal nitrides are tantalum nitrides.

19. The electronic device according to claim 18, wherein a metal-to-nitrogen bonding ratio of the first metal nitride ranges from approximately 1:1 to approximately 1:1.5, and
   wherein a metal-to-nitrogen bonding ratio of the second metal nitride is approximately 3:5.

* * * * *